United States Patent
Maurin-Perrier et al.

(10) Patent No.: US 7,758,963 B2
(45) Date of Patent: Jul. 20, 2010

(54) CORROSION RESISTANT COATING BASED ON SILICON, CARBON, HYDROGEN AND NITROGEN

(75) Inventors: Philippe Maurin-Perrier, Saint-Marcellin-En-Forez (FR); Christophe Heau, Saint-Etienne (FR); Yves Gachon, Saint-Just-Saint-Rambert (FR)

(73) Assignee: H.E.F., Andrezieux Boutheon (FR)

( * ) Notice: Subject to any disclaimer, the term of this patent is extended or adjusted under 35 U.S.C. 154(b) by 59 days.

(21) Appl. No.: 12/088,856

(22) PCT Filed: Sep. 28, 2006

(86) PCT No.: PCT/FR2006/002198

§ 371 (c)(1),
(2), (4) Date: Apr. 1, 2008

(87) PCT Pub. No.: WO2007/039679

PCT Pub. Date: Apr. 12, 2007

(65) Prior Publication Data

US 2008/0220248 A1 Sep. 11, 2008

(30) Foreign Application Priority Data

Oct. 3, 2005 (FR) .................................. 05 10083

(51) Int. Cl.
*B32B 9/00* (2006.01)
*C23C 16/22* (2006.01)

(52) U.S. Cl. .................. 428/408; 428/446; 428/698; 427/249.1; 427/249.15

(58) Field of Classification Search .................. 428/332, 428/698, 408, 704, 688, 699
See application file for complete search history.

(56) References Cited

U.S. PATENT DOCUMENTS 5,843,571 A * 12/1998 Sho .............................. 428/336

FOREIGN PATENT DOCUMENTS

WO 00/75394 A 12/2000

OTHER PUBLICATIONS

Zhou et al., "Hard silicon carbonitride fims obtained by RF-plasma-enhanced chemical vapour deposition using the single-source precursor bis(trimethylsilyl)carbodimide," J. of Eur. Cer. Soc., vol. 26, No. 8, pp. 1325-1335 (Mar. 19, 2005).
Probst et al., "Development of PE-CVD Si/C/N:H films for tribological and corrosive complex-load conditions," Surf. and Coat. Tech., vol. 200, pp. 355-359 (Oct. 1, 2005).
Wrobel et al., "Silicon Carbonitride Films by Remote Hydrogen-Nitrogen Plasma CVD from a Tetramethyldisilazane Source," J. of Electrochem. Soc., vol. 151, No. 11, pp. C723-C730 (Nov. 2004).
De Martino et al., "Mechanical and physical properties of amorphous carbon-based alloys," Diamond & Rel. Mat., vol. 5, No. 3-5, pp. 461-465 (Apr. 1996).
Heyner et al., "High power deposition and analytics of amorphous silicon carbide films," Thin Solid Films, vol. 258, No. 1/2, pp. 14-20 (Mar. 15, 1995).

* cited by examiner

*Primary Examiner*—Timothy M Speer
(74) *Attorney, Agent, or Firm*—Young & Thompson

(57) ABSTRACT

A coating includes a thin film which is intended to protect a corrodible part against corrosion and, to some extent, against wear and friction. The coating essentially includes a composition containing silicon, carbon, hydrogen and nitrogen such that: the atomic hydrogen concentration, measured using the ERDA technique, is 20 ±5 atoms %; the atomic silicon concentration, measured using the Rutherford backscattering (RBS) technique, is between 15 and 28 atoms %; the ratio of the atomic concentrations of nitrogen and carbon (N/C) is greater than 0.9; and the hardness of the material is less than or equal to 2100 daN/mm2.

20 Claims, No Drawings

CORROSION RESISTANT COATING BASED ON SILICON, CARBON, HYDROGEN AND NITROGEN

FIELD OF THE INVENTION

The invention concerns the protection of parts the surface whereof is sensitive to corrosion (wet or dry) and possibly, to a lesser degree, to friction and to wear. To be more precise, the field of the invention is that of surface treatments and coatings intended to resist corrosion whether accompanied by friction and wear or not.

The parts at which the invention is aimed are in practice corrodible metal parts, by way of nonlimiting example parts made of steel, aluminum alloy, magnesium alloy, or non-metal parts coated with a corrodible metal, preferably structural or surface mechanical parts, by way of non-exclusive example in the automobile or construction field.

STATE OF THE ART

Surface treatment and coating methods for depositing on the surface of materials a layer that confers on them good resistance to corrosion (wet or dried, acidic or basic) have been known for a very long time. All methods for depositing paint and varnish may be cited. There are also electrolytic methods for depositing protective metals, such as zinc for protecting steel or, more generally, nickel, chromium, etc., generally with thicknesses greater than 10 μm. Taken as a whole, these methods and materials confer on the coated parts a greater or lesser resistance to corrosion (according to their thickness in particular) but generally (except where chromium is concerned) do not provide any particular resistance to mechanical aggression such as friction and wear.

Moreover, protecting the surface of parts against friction and wear with layers of ceramic such as enamels or certain metal layers such as chromium is known in the art. However, in this case, the corrosion resistance is low unless the deposited protective layer is very thick (typically several tens of microns thick). There are more recent coatings that have a very high effectiveness in the fight against wear. These are nitrides of transition metals, such as TiN, CrN, TiAlN, etc. Their very high hardness confers a very high resistance to wear on them, but current deposition technologies cannot deposit them to a great thickness and so they can provide virtually no corrosion protection. The same applies to amorphous carbon coatings that protect effectively against friction and wear but the thickness whereof does not exceed a few micrometers in the best case, and so cannot provide effective corrosion protection.

Electrolytically depositing cadmium or lead, processes that have been used for a long time, have nowadays been abandoned because of the toxicity of these materials and their negative impact on the environment. Electrolytically depositing chromium also has a negative impact on the environment, and changes to the legislation on waste are making them more and more difficult to use.

At present, the solutions enabling iron alloys to resist corrosion and also friction and wear are essentially technologies based on the combination of nitriding and oxidation, but their use necessitates high temperatures, in all cases above 500° C. At present, numerous parts are produced in metals and alloys that can become distorted and/or lose their mechanical characteristics if they are heated above 200° C.

There is therefore still a need at present for a coating capable of enabling a structural or surface part in a corrodible material, whether steel, aluminum alloy or magnesium alloy, to resist corrosion and also, at least to some degree, friction and wear, without requiring either a high process temperature or too great a thickness.

DESCRIPTION OF THE INVENTION

The invention is based on the surprising and unexpected discovery of properties of thin layers of complex composition based on silicon and also containing carbon, nitrogen and hydrogen, these four elements Si, C, H and N being present in clearly defined proportions. It has been found that, even with small thicknesses of the order of one micron, these layers effectively protect ferrous metals, for example, during several hundred hours exposure to salt spray, while their high hardness confers on them a resistance to wear comparable to that of the metal nitrides cited above.

This result is entirely unexpected because it is commonly accepted and proven that, with the exception of cathodic protection (protection of steel by zinc and aluminum), thin layers inevitably include defects and are therefore porous, allowing aggressive liquids to reach and corrode the substrate, thus generating the well-known phenomenon of pinhole corrosion.

Thin layers based on silicon are already known in themselves in other applications. Thus thin layers containing nitrogen ($SiO_x$) used as barrier layers on polymers or for water-resistant treatment of textiles are known in themselves. Thin layers of silicon containing carbon and hydrogen, often called "a-SiC:H", are also known in themselves and are of benefit from the tribological point of view but do not confer any corrosion protection.

In the present state of the art, the protection provided by these thin SiCHN layers is still unexplained.

To be more precise, the invention proposes a thin layer coating for protecting against corrosion a part made from a corrodible metal material or a material coated with a layer of corrodible metal, such as alloys based on Fe, Al or Mg, essentially consisting of silicon, carbon, hydrogen and nitrogen with a composition such that:

the atomic content of hydrogen, as measured by the ERDA technique, is 20±5 atomic percent, the atomic content of silicon as measured by the Rutherford backscattering (RBS) technique is between 15 and 28 atomic percent, the ratio (N/C) of the atomic concentrations of nitrogen and carbon is greater than 0.9, the hardness of the material is less than or equal to 2100 $daN/mm^2$.

The corrosion resistance of a part coated with a thin layer conforming to the above conditions has proved to be excellent. Moreover, complying with the maximum threshold for the hardness of the material (which seems important for good corrosion resistance) has proved entirely compatible with good resistance to wear and to friction. In a preferred embodiment of the invention, a layer with a hardness greater than 800 $daN/mm^2$ is used.

There is a preferred field of implementation of the invention that corresponds to a ratio N/C greater than or equal to 1 (or even greater than or equal to 1.2), all other conditions otherwise remaining the same.

An upper limit on the ratio N/C has been identified at around 2.5; however, this is no more than experimental limit, higher values not being accessible in the current state of the art; it can therefore reasonably be considered that this limit has no physical significance and that the invention encompasses higher N/C values.

It is important that the concentration of silicon, carbon and nitrogen is measured by the RBS technique because this is the only technique that features no artifacts in very thin layers; in contrast, quantitative measurements using techniques of the SIMS or ESCA type must be used with many precautions. Moreover, in the current state of the art, the only reliable technique for dosing hydrogen is the ERDA (Elastic Recoil Detection Analysis) technique.

Note that the fact that, according to the definition of the invention, the coating is "essentially" of silicon, carbon, hydrogen and nitrogen implies that there are no other significant components, without excluding the possibility of there being impurities stemming in particular from the technique for depositing the coating (to a maximum of a few percent, typically of the order of 5 atomic percent maximum).

Thus the SiCHN layer of the invention preferably contains no oxygen, the applicant having shown that the presence of that element in the layer significantly degrades the corrosion resistant protection conferred on the coated parts. A high oxygen content also degrades the mechanical and tribological properties of the coatings. Nevertheless, as a function of the production conditions, oxygen may be found at the impurity level without its presence having a significant influence on the properties of the coating.

In practice, a coating of the invention has proved effective from a thickness of 0.1 μm. Much greater thicknesses are possible (high thicknesses do not degrade the properties of the layer), but it has proved of no benefit to choose a thickness greater than 5 μm. The thickness is advantageously between 0.1 micron and 5 microns, preferably between 0.5 micron and 2.5 microns, which represents a good compromise between quantity of material deposited and efficacy.

The four components essential to a coating of the invention, Si, C, H and N, are present in concentrations of several tens of percent. However, it seems advantageous for the atomic nitrogen content to be greater than each of the atomic contents of silicon, carbon and hydrogen, preferably at least equal to 29 atomic percent. Given the presence of the other components, the nitrogen content is preferably at most equal to 40 atomic percent, but it seems especially effective for this content to be between 29 atomic percent and 33 atomic percent.

Like hydrogen, silicon and carbon advantageously have concentrations between 15 atomic percent and 26 atomic percent.

Although the definition of the invention refers to only a maximum threshold for the hardness, it is clear that the resistance to wear and to friction will improve as this hardness increases, in compliance with this maximum threshold; in practice, it can be estimated that a coating of the invention combines good corrosion resistance and good resistance to wear and to friction if the hardness exceeds a value of the order of 800 $daN/mm^2$.

Although a number of types of method can be envisaged for implementing the coatings of the invention, the invention teaches using the plasma-assisted chemical vapor phase deposition process, which consists in decomposing a precursor gas using energetic species generated by an electrical discharge.

Note that this type of technique involves temperatures below 500° C., having in particular none of the drawbacks of the nitriding-oxidation treatments.

The coating of the invention can obviously be used on its own to protect a substrate against corrosion and friction, but its use in combination with another material conferring new properties on the treated surface is also part of the invention; thus the invention covers in particular the use of a thin layer with the composition SiCHN as defined hereinabove as a sub-layer that is thereafter covered with a deposit of amorphous carbon, advantageously of the DLC (Diamond Like Carbon doped or undoped), to give the treated parts additional resistance to wear and to friction complementing the very good corrosion resistance provided by the SiCHN underlayer but does not bring with it any amorphous carbon. Such amorphous carbon deposits preferably have a thickness from 0.1 to 5 μm.

The invention also covers a part of which at least one superficial layer is of a corrodible metal material (in particular iron alloy, aluminum alloy or magnesium alloy) and covered with a thin layer of the type referred to above.

Examples of Coatings Conforming or not Conforming to the Invention

The following examples concern layers produced by the plasma-assisted chemical vapor phase deposition technique on substrates of the same type (carbon steel) to facilitate comparison of the results and performance. Their thickness was measured at between 1.7 and 3.7 μm.

These layers are characterized by the ERDA technique with regard to their hydrogen content, by the RBS technique with regard to the other elements; the corrosion resistance conferred on the substrate by the layer was measured by the time necessary for the first pinhole to appear during exposure to the salt spray test (ISO standard 9227), a duration exceeding 200 h being considered acceptable, whereas lower values are considered as corresponding to insufficient resistance (the values indicated are averages for three corrosion resistance measurements)

Moreover, the coatings were tested for wear resistance by means of a ball-disk type test. The 10 mm diameter steel ball was coated with the various deposits. The test consists in rubbing the ball against a steel disk. A load of 5 N is applied to the ball. The disk turns at 50 revolutions per minute for 5000 turns. The diameter of the rubbing track being 20 mm, the distance traveled by the end of the test is 314 m. At the end of the test, the wear face on the coated ball takes the form of a dome. The diameter of this dome gives an indication as to the wear resistance of the deposit. The smaller the wear dome, the greater the wear resistance of the deposit.

The table below summarizes the results obtained with layers conforming to the invention and other layers not conforming to the invention:

| Example | H at % | Si at % | C at % | N at % | N/C | Hardness ($daN/mm^2$) | Corrosion resistance (h) | Conformance with invention | Thickness (μm) | Worn diameter (μm) |
|---|---|---|---|---|---|---|---|---|---|---|
| 1 | 20 | 20 | 60 | 0 | 0 | 3 300 | 24 | NC | 2.3 | 180 |
| 2 | 20 | 20 | 60 | 0 | 0 | 2 000 | 120 | NC | 2 | 260 |
| 3 | 20 | 12.8 | 67.2 | 0 | 0 | 2 100 | 24 | NC | 3.4 | 240 |
| 4 | 20 | 6 | 74 | 0 | 0 | 2 050 | 88 | NC | 3.7 | 220 |

-continued

| Example | H at % | Si at % | C at % | N at % | N/C | Hardness (daN/mm²) | Corrosion resistance (h) | Conformance with invention | Thickness (µm) | Worn diameter (µm) |
|---|---|---|---|---|---|---|---|---|---|---|
| 5 | 20 | 25.2 | 19.6 | 35.2 | 1.80 | 1 750 | 348 | C | 2.7 | 270 |
| 6 | 21.2 | 26 | 23.6 | 29.2 | 1.24 | 1 950 | 808 | C | 2.1 | 230 |
| 7 | 22.2 | 25.4 | 19.4 | 32.7 | 1.69 | 2 050 | 702 | C | 1.7 | 230 |
| 8 | 20 | 23.2 | 16.8 | 40 | 2.38 | 1 615 | 472 | C | 1.7 | 300 |
| 9 | 20 | 26.4 | 32.8 | 20.8 | 0.63 | 2 100 | 56 | NC | 2.5 | 220 |
| 10 | 19.2 | 28 | 39.2 | 13.6 | 0.35 | 2 600 | 24 | NC | 3 | 200 |
| 11 | 20 | 26 | 32.8 | 21.2 | 0.65 | 2 000 | 120 | NC | 2.8 | 260 |
| 12 | 19.2 | 24.8 | 30.4 | 25.6 | 0.84 | 1 700 | 64 | NC | 1.9 | 300 |
| 13 | 20 | 26 | 28.8 | 25.2 | 0.88 | 2 100 | 168 | NC | 3.1 | 230 |
| 14 | Layer of example 6 + DLC | | | | | 3400 | 784 | C | 6.0 | 150 |
| 15 | substrate not coated | | | | | 850 | <6 | control | / | 620 |

Example 14 concerns a substrate coated with the same SiCHN layer as that described in example 6; this layer is itself coated with a DLC layer 5 µm thick. The hardness having been measured from above, it naturally corresponds to that of the surface layer, i.e. the DLC layer.

Example 15 shows the behavior of a tool steel with no coating.

Note that examples 1 to 4 explain the benefit of the presence of nitrogen, while examples 9 to 12 demonstrate the importance of the ratio N/C, example 13 appearing to constitute a limit that may explain the threshold of 0.9 for the ratio N/C.

Where the "good" examples are concerned (letter C in the antepenultimate column), note that their hardness is significantly less than the threshold of 2100 daN/mm², and that their N/C ratio is substantially higher than 1 (at least 1.2 in example 6) with a value up to 2.4 (example 8); the nitrogen content is greater than each of the contents of Si, C or H (at least 29 atomic percent, with an example at 40 atomic percent without this appearing to constitute a limit).

Comparison of the best two examples (6 and 7) seems to demonstrate that the H content can equally well be either greater than or less than that of Si, the two elements being present at atomic concentrations within the same range of 20±5 atomic percent; moreover, the carbon content is in the same range, whereas the nitrogen content is higher than each of the contents of Si, C and H, within a range of 29 atomic percent to 40 atomic percent. It is reasonable to consider that these correlations are advantageous for obtaining good corrosion resistance.

Note also from the examples and counter-examples indicated that there is no evident correlation between corrosion resistance and thickness. For example, example N° 4, although the thickest, has a corrosion resistance of only 88 h. Of the examples conforming to the invention, the highest performing deposit in terms of corrosion (example N° 6) is not the thickest.

The wear values of deposits that conform to the invention are within a range comparable with that obtained for deposits that do not conform to the invention and are characteristic of hard coating wear values. Example 14 shows the increase in wear resistance if a deposit that conforms to the invention is coated with DLC. By way of illustration, an uncoated steel ball produces 2.1 to 2.7 times more wear than deposits that conform to the invention, the increase reaching 4.1 if a DLC deposit is added to a coating that conforms to the invention.

Substrates of carbon steel, aluminum alloy or magnesium alloy have been coated with an approximately 1 micron layer whose composition conforms to the foregoing teachings, and then by a deposit of DLC type amorphous carbon 5 microns thick. Not only has good corrosion resistance been demonstrated conforming to that of the good examples, but improved wear resistance and a reduced coefficient of friction were also seen.

The invention claimed is:

1. A thin layer coating for protecting against corrosion a corrodible metal material part, said coating essentially consisting of silicon, carbon, hydrogen and nitrogen with a composition such that:
   the atomic content of hydrogen, as measured by the ERDA technique, is 20±5 atomic percent,
   the atomic content of silicon as measured by the Rutherford back scattering (RBS) technique is between 15 and 28 atomic percent,
   the ratio (N/C) of the atomic concentrations of nitrogen and carbon is greater than 0.9,
   the hardness of the material is less than or equal to 2100 daN/mm².

2. Thin layer coating according to claim 1, characterized in that the ratio (N/C) of the atomic concentrations of nitrogen and carbon is greater than 1.

3. Thin layer coating according to claim 2, characterized in that the ratio (N/C) of the atomic concentrations of nitrogen and carbon is at least equal to 1.2.

4. Thin layer coating according to claim 1, characterized in that it includes a maximum of 5 atomic percent of any impurities.

5. Thin layer coating according to claim 1, characterized in that its thickness is greater than 0.1 µm but less than 5 microns.

6. Thin layer coating according to claim 5, characterized in that its thickness is between 0.5 and 2.5 microns.

7. Thin layer coating according to claim 1, characterized in that the atomic content of nitrogen is greater than each of the atomic contents of silicon, carbon and hydrogen.

8. Thin layer coating according to claim 7, characterized in that the atomic content of nitrogen is at least equal to 29 atomic percent.

9. Thin layer coating according to claim 8, characterized in that the atomic content of nitrogen is at most equal to 40 atomic percent.

10. Thin layer coating according to claim 9, characterized in that the atomic content of nitrogen is at most equal to 33 atomic percent.

11. Thin layer coating according to claim 1, characterized in that the atomic contents of silicon and carbon are between 15 atomic percent and 26 atomic percent.

12. Thin layer coating according to claim 1, characterized in that the hardness is at least equal to 800 daN/mm$^2$.

13. Thin layer coating according to claim 1, characterized in that it is covered with a layer of doped or undoped amorphous carbon.

14. Mechanical part at least a superficial layer of which is of corrodible metal material and which is coated with a thin layer according to claim 1.

15. Part according to claim 14, characterized in that the thin layer is covered with a layer of doped or undoped amorphous carbon.

16. Thin layer coating according to claim 2, characterized in that it includes a maximum of 5 atomic percent of any impurities.

17. Thin layer coating according to claim 2, characterized in that its thickness is greater than 0.1 μm but less than 5 microns.

18. Thin layer coating according to claim 2, characterized in that the atomic content of nitrogen is greater than each of the atomic contents of silicon, carbon and hydrogen.

19. Thin layer coating according to claim 2, characterized in that the atomic contents of silicon and carbon are between 15 atomic percent and 26 atomic percent.

20. A method for protecting a corrodible metal material part against corrosion, comprising the steps of applying a thin layer coating to the part, the coating essentially consisting of silicon, carbon, hydrogen and nitrogen with a composition such that:

the atomic content of hydrogen, as measured by the ERDA technique, is 20 ±5 atomic percent, the atomic content of silicon as measured by the Rutherford back scattering (RBS) technique is between 15 and 28 atomic percent, the ratio (N/C) of the atomic concentrations of nitrogen and carbon is greater than 0.9, the hardness of the material is less than or equal to 2100 daN/mm$^2$.

* * * * *